United States Patent
Kurose (10) Patent No.: US 10,084,471 B1
(45) Date of Patent: Sep. 25, 2018

(54) ANALOG TO DIGITAL CONVERTER AND WIRELESS COMMUNICATION DEVICE

(71) Applicant: Kabushiki Kaisha Toshiba, Minato-ku, Tokyo (JP)

(72) Inventor: Daisuke Kurose, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/699,078

(22) Filed: Sep. 8, 2017

(30) Foreign Application Priority Data

Mar. 14, 2017 (JP) .................. 2017-048531

(51) Int. Cl.
| | |
|---|---|
| *H03M 1/00* | (2006.01) |
| *H03M 1/46* | (2006.01) |
| *H03M 1/12* | (2006.01) |
| *H04B 1/40* | (2015.01) |
| *H03K 5/133* | (2014.01) |
| *H03K 5/00* | (2006.01) |

(52) U.S. Cl.
CPC ............ *H03M 1/462* (2013.01); *H03K 5/133* (2013.01); *H03M 1/1245* (2013.01); *H04B 1/40* (2013.01); *H03K 2005/00026* (2013.01)

(58) Field of Classification Search
CPC ...................................................... H03M 1/66
USPC ................................................. 341/144, 126
See application file for complete search history.

(56) References Cited

U.S. PATENT DOCUMENTS

| | | |
|---|---|---|
| 2005/0141662 A1 | 6/2005 | Sano et al. |
| 2010/0316098 A1 | 12/2010 | Pals et al. |
| 2012/0032824 A1 | 2/2012 | Yoshioka |
| 2013/0102264 A1 | 4/2013 | Nakane et al. |
| 2015/0171879 A1 | 6/2015 | Kimura et al. |
| 2016/0254821 A1* | 9/2016 | Luo ................. H03M 1/125 341/161 |
| 2017/0078993 A1 | 3/2017 | Ogasawara |
| 2017/0093414 A1* | 3/2017 | Sun ................. H03M 1/08 |

FOREIGN PATENT DOCUMENTS

| | | |
|---|---|---|
| JP | 2005-191831 A | 7/2005 |
| JP | 2012-039475 A | 2/2012 |
| JP | 2013-093694 A | 5/2013 |
| JP | 5705841 B2 | 4/2015 |
| JP | 2015-115883 A | 6/2015 |
| JP | 2017-055363 A | 3/2017 |

* cited by examiner

*Primary Examiner* — Kevin Kim
(74) *Attorney, Agent, or Firm* — White & Case LLP (57) ABSTRACT

According to one embodiment, an analog-to-digital converter includes: a digital-to-analog converter configured to generate an analog voltage based on a sampled analog signal and a digital code; a clock generator configured to generate a first clock signal; a comparator configured to receive the analog voltage from the digital-to-analog converter, and perform digital output based on the first clock signal; and a controller configured to generate the digital code based on the digital output of the comparator. The clock generator varies a delay period, which is from the end of sampling of the analog signal to the start of generating the first clock signal, for each sampling of the analog signal.

20 Claims, 9 Drawing Sheets

ANALOG TO DIGITAL CONVERTER AND WIRELESS COMMUNICATION DEVICE

CROSS-REFERENCE TO RELATED APPLICATIONS

This application is based upon and claims the benefit of priority from Japanese Patent Application No. 2017-048531, filed Mar. 14, 2017, the entire contents of which are incorporated herein by reference.

FIELD

Embodiments described herein relate generally to an analog to digital converter and a wireless communication device.

BACKGROUND

A successive approximation type AD converter is known as an analog-to-digital converter (hereinafter described as "AD converter" or "ADC"). In a wireless communication device that includes an AD converter in a receiver, a harmonic of a clock signal used at the AD converter becomes an extraneous emission (spurious emission). The spurious emission in a frequency band of a received radio-frequency (RF) signal may sometimes cause noise and degrade reception sensitivity of the radio-frequency signal.

DETAILED DESCRIPTION

In general, according to one embodiment, an analog-to-digital converter includes: a digital-to-analog converter configured to generate an analog voltage based on a sampled analog signal and a digital code; a clock generator configured to generate a first clock signal; a comparator configured to receive the analog voltage from the digital-to-analog converter, and perform digital output based on the first clock signal; and a controller configured to generate the digital code based on the digital output of the comparator. The clock generator varies a delay period from the end of sampling the analog signal to the start of generating the first clock signal for each sampling of the analog signal.

1. First Embodiment

An analog-to-digital converter (hereinafter described as "AD converter" or "ADC") and a wireless communication device according to the first embodiment will be explained. In the following, a case in which the AD converter is a successive approximation type AD converter will be explained.

1. 1. General Configuration of Wireless Communication Device

Figure 1:
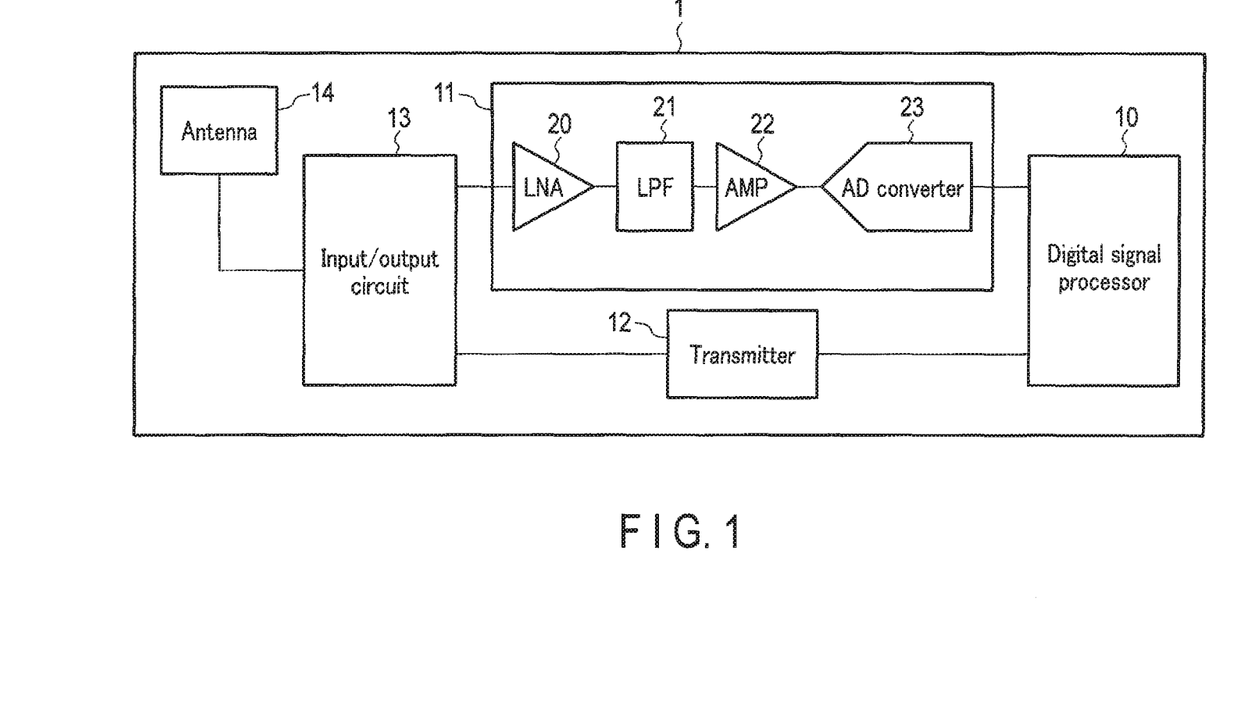
FIG. 1 is a block diagram showing a configuration of a wireless communication device according to a first embodiment.

First, a general configuration of the wireless communication device will be explained. A wireless communication device 1 includes a digital signal processor 10, a receiver 11, a transmitter 12, an input/output circuit 13, and an antenna 14.

The receiver 11 converts a radio-frequency signal (hereinafter described also as "analog signal") received from an external device into a digital signal, and transmits the digital signal to the digital signal processor 10. The receiver 11 includes a low noise amplifier (LNA) 20, a low pass filter (LPF) 21, an amplifier (AMP) 22, and an AD converter 23.

The low noise amplifier 20 amplifies a weak analog signal received through the antenna 14 and the input/output circuit 13 with relatively low noise.

The low-pass filter 21 attenuates a frequency component that is lower than a cut-off frequency with respect to the analog signal amplified at the low noise amplifier 20.

The amplifier 22 amplifies the analog signal filtered at the low-pass filter 21 to an amplitude (voltage) necessary for processing at the AD converter 23.

The AD converter 23 converts the input analog signal into a digital signal, and transmits the digital signal to the digital signal processor 10.

The digital signal processor 10 performs various kinds of processing based on the digital signal received from the receiver 11. The digital signal processor 10 also transmits the digital signal to the transmitter 12 based on the result of the processing.

The transmitter 12 includes an unillustrated digital-to-analog converter, converts the digital signal received from the digital signal processor 10 into an analog signal, and transmits the analog signal to the input/output circuit 13.

The input/output circuit 13 transmits a signal received from the antenna 14 to the receiver 11, and transmits a signal received from the transmitter 12 to an external device through the antenna 14.

1.2 Configuration of AD Converter

Figure 2:
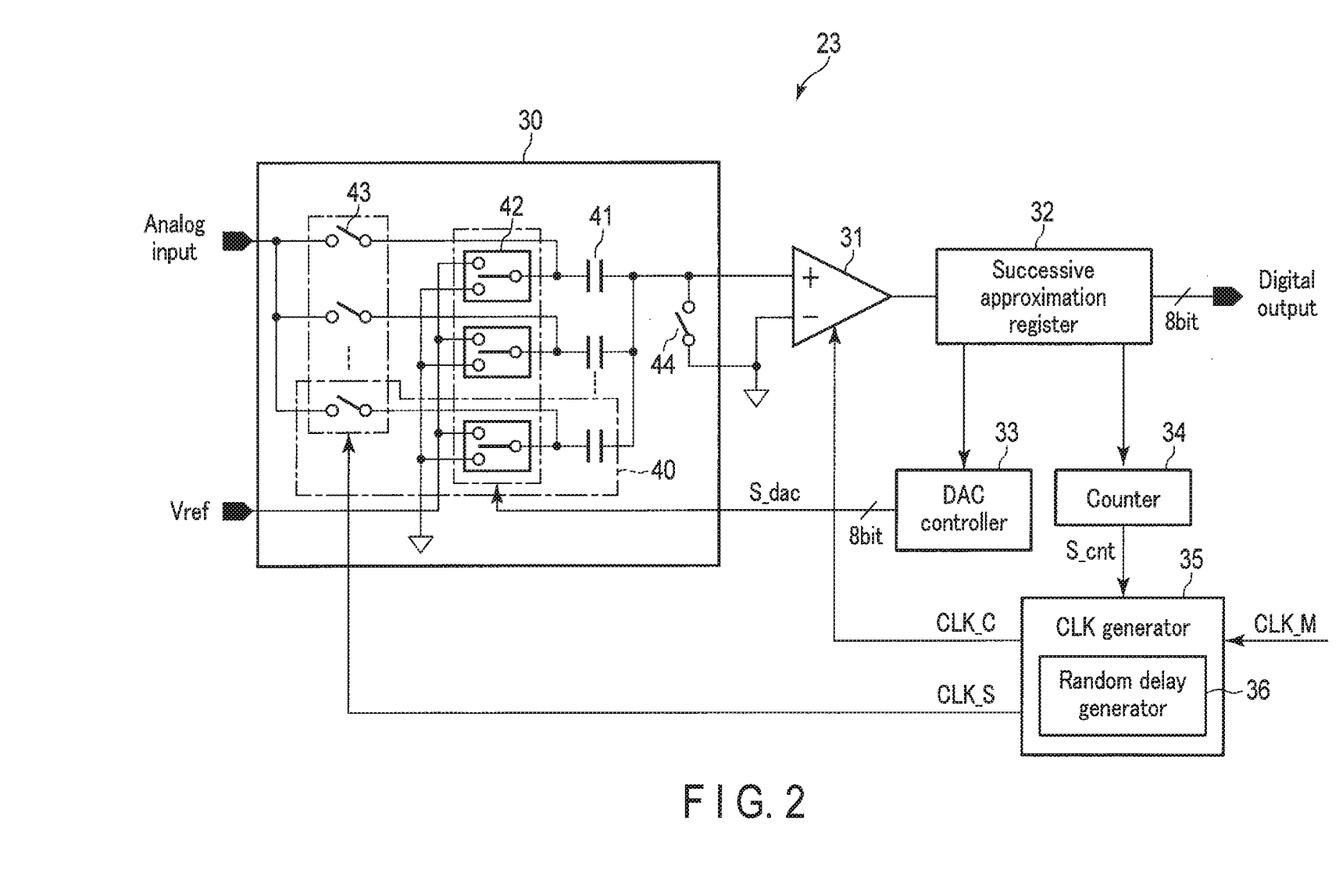
FIG. 2 is a block diagram of an analog-to-digital converter according to the first embodiment.

The configuration of the AD converter 23 will be explained using FIG. 2. In the example of FIG. 2, the AD converter 23 generating an 8 bit-digital signal is shown. However, the number of bits of the digital signal to be generated can be appropriately set. In a successive approximation type AD converter 23, a successive approximation between a voltage Va of an analog signal and a voltage based on a reference voltage Vref is performed in series from a most significant bit (MSB), and a digital signal is generated. The reference voltage Vref is a voltage that becomes a reference when determining the voltage Va of the analog signal. When determining the MSB, for example, in the case where the voltage Va is equal to or higher than ½ Vref ((Va−½ref)≥0), the MSB is determined as being a "High" ("H") level (data "1"), and in the case where the voltage Va is lower than ½ Vref ((Va−½ref)<0), the MSB is determined as being a "Low" ("L") level (data "0"). When determining the next significant bit, in the case where the bit is data "1", a comparison between the voltage Va and a (½+¼)Vref is performed, and in the case where the bit is data "0", a comparison between the voltage Va and a (½−¼)Vref is performed.

The AD converter 23 includes a digital-to-analog converter (hereinafter described as "DAC") 30, a comparator 31, a successive approximation register 32, a DAC controller 33, a counter 34, and a CLK generator 35.

Two input terminals of the DAC 30 are coupled respectively to an analog signal input terminal and a reference voltage Vref input terminal of the AD converter 23. An output terminal of the DAC 30 is coupled to a non-inverting input terminal ("+" terminal) of the comparator 31. When sampling the analog signal, the DAC 30 temporarily stores the voltage Va of the analog signal. When performing successive approximation, the DAC 30 generates an analog voltage Vd that is different for each bit to be compared based on an 8-bit digital signal S_dac received from the DAC controller 33, and combines the voltage Vd with the voltage Va of the analog signal. This combined voltage is then output to the comparator 31. The DAC 30 includes a plurality of sampling circuits 40, and a switching element 44. The number of sampling circuits 40 is determined based on the number of bits of the AD converter 23.

Each of the sampling circuits 40 includes a capacitance element 41, and switching elements 42 and 43. The capacitance value of each of the capacitance elements 41 included in the sampling circuits 40 is different. In the 8-bit AD converter 23, for example, the capacitance value is set so that voltages of ½Vref, ¼Vref, ..., ½$^n$Vref (n is the number of bits) are generated for the reference voltage Vref. A first electrode of the capacitance element 41 is coupled to an output terminal of the switching element 42, and a second electrode is coupled to the output terminal of the DAC 30.

As for the switching element 42, the voltage Vref is applied to a first input terminal, and a second input terminal is grounded. In the case where the switching element 43 is in an OFF state, the switching element 42 selects the first input terminal or the second input terminal in accordance with the signal S_dac.

As for the switching element 43, an input terminal is coupled to an analog signal terminal, and an output terminal is coupled to the first electrode of the capacitance element 41. The switching element 43 couples the analog signal input terminal and each of the sampling circuits 40 in accordance with a sampling clock signal CLK_S received from the CLK generator 35.

The switching element 44 grounds the output terminal of the DAC 30 in accordance with a clock signal (unillustrated) received from the CLK generator 35.

When the DAC 30 samples the analog signal, for example, in each of the sampling circuits 40, the switching element 43 is set to an ON state, and the switching element 42 becomes a state in which the first and second terminals are not selected. The switching element 44 is set to an ON state. This allows the capacitance element 41 of each of the sampling circuits 40 to be charged by the voltage Va of the analog signal.

In the case where the DAC 30 generates the analog voltage in accordance with the digital signal S_dac, the switching elements 43 of each of the sampling circuits 40 are set to an Off state. The switching element 42 selects one of the first and second input terminals in accordance with the digital signal S_dac.

An inverting input terminal ("−" terminal) of the comparator 31 is grounded, and the output terminal is coupled to the successive approximation register 32. The comparator 31 compares the voltage sampled at the DAC 30 for each bit (that is, the combined voltage between the voltage Va of the analog signal and the analog voltage Vd generated at the DAC) with a ground potential, and transmits the comparison result to the successive approximation register 32. The comparator 31 performs a comparison in the case where a comparator clock signal CLK_C received from the CLK generator 35 is, for example, an "H" level.

The successive approximation register 32 temporarily stores the 8-bit digital signal received from the comparator 31. The 8-bit digital signal stored by the successive approximation register 32 is transmitted to the DAC controller 33, the counter 34, and the output terminal of the AD converter 23.

The DAC controller 33 transmits the 8-bit digital signal S_dac to the DAC 30, and controls the DAC 30. More specifically, the DAC controller 33 generates the signal S_dac based on the digital signal of each bit (result of successive approximation) received from the successive approximation register 32, and transmits the signal S_dac to the DAC 30.

The counter 34 performs a count-up every time the successive approximation register 32 stores the result of the successive approximation (digital signal of each bit). When the number of counts reaches eight times, the counter 34 notifies the CLK generator 35 accordingly. More specifically, the counter 34 transmits a count signal S_cnt to the CLK generator. The count signal S_cnt, for example, is set to level "L" during a period in which the count is executed. In the case where the number of counts has reached eight times, that is, in the case where the successive approximation is ended, the counter 34 sets the count signal S_cnt to level "H", and resets the number of counts.

The CLK generator 35 generates the sampling clock signal CLK_S and the comparator clock signal CLK_C based on, for example, a master clock signal CLK_M input from an external device and the count signal S_cnt. In the case of generating the comparator clock signal CLK_C, the CLK generator 35 sets a period (hereinafter referred to as delay period Tdly) from the end of sampling to the start of successive approximation in different lengths for each sampling of the analog signal. The CLK generator 35 includes a random delay generator 36.

The random delay generator 36 generates a random length of delay period Tdly, for example, at a timing when the master clock signal CLK_M rises (end of sampling).

1.3 Overall Flow of Operation of AD Conversion

The overall flow of an AD conversion operation will be explained using FIG. 3.

Figure 3:
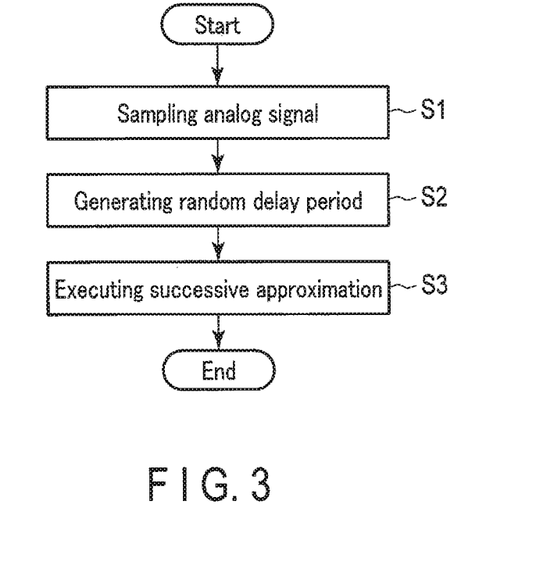
FIG. 3 is a flowchart showing an operation of the analog-to-digital converter according to the first embodiment.

As shown in FIG. 3, at first, the AD converter 23 samples the analog signal (step S1). More specifically, the DAC 30 takes in the voltage Va of the analog signal.

When sampling is ended, the CLK generator 35 generates a random length of delay period Tdly at the random delay generator 36 (step S2). More specifically, when, for example, the master clock signal CLK_M rises from level "L" to level "H", the CLK generator 35 sets the sampling clock signal CLK_S to level "L" (end of sampling), and generates a random delay period Tdly therein.

After the delay period Tdly has passed, the AD converter 23 executes successive approximation in accordance with the timing of the comparator clock signal CLK_C (step S3). More specifically, after the delay period Tdly has passed, the CLK generator 35 asserts a conversion signal S_cv at level "H". During the period in which the conversion signal S_cv is level "H" (hereinafter referred to as conversion period Tconv), the CLK generator 35 generates the comparator clock signal CLK_C and transmits this signal to the comparator 31. The comparator 31 executes successive approximation in accordance with a pulse of the comparator clock signal CLK_C, and transmits the result to the successive approximation register 32. When the conversion signal S_cv of level "H" is received, the counter 34 sets the count signal S_cnt to level "L", and counts the number of bits of the data stored in the successive approximation register 32.

In the case where the number of counts has reached eight times, the counter 34 sets the count signal S_cnt to level "H". When the count signal S_cnt of level "H" is received, the CLK generator 35 sets the conversion signal S_cv to level "L". When the conversion signal S_cv is set to level "L", the CLK generator 35 ends the generation of the comparator clock signal CLK_C, and sets the sampling clock signal CLK_S to level "H" (start next sampling). When the conversion signal S_cv of level "L" is received, the counter 34 sets the count signal S_cnt to level "H", and resets the number of counts.

In this manner, the AD conversion of the analog signal in a cycle is ended.

1.4 Each Signal Upon AD Conversion Operation

Figure 4:
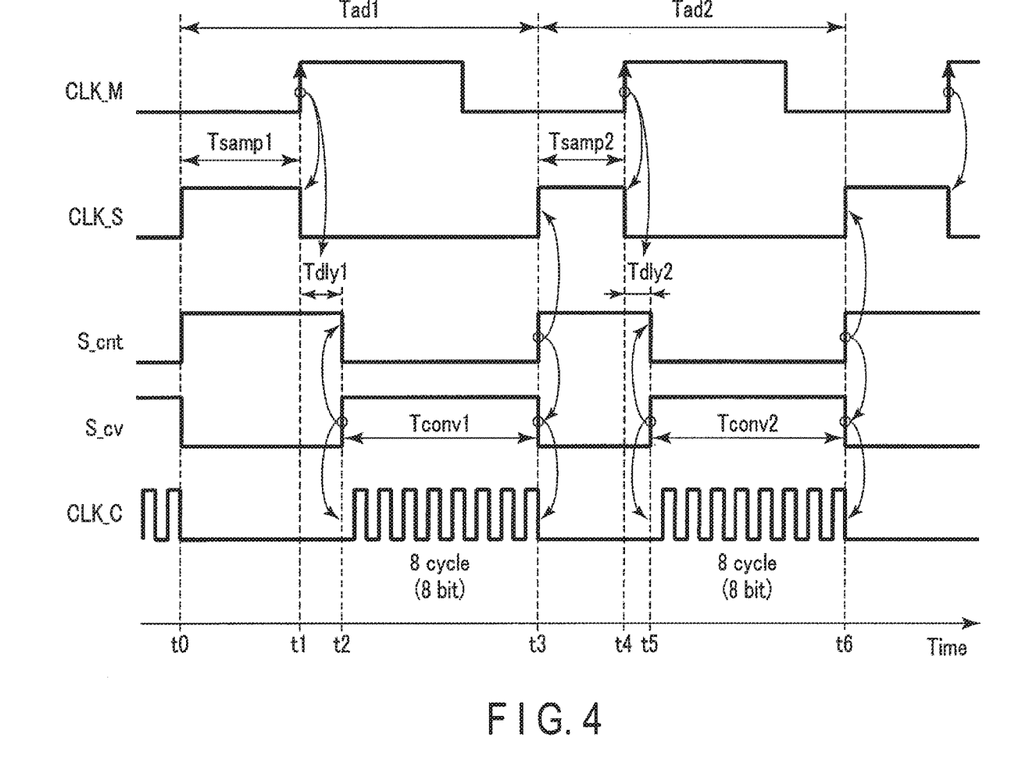
FIG. 4 is a timing chart showing the operation of the analog-to-digital converter according to the first embodiment.

Each signal upon AD conversion operation will be explained using FIG. 4. The example of FIG. 4 shows an abstract of the AD conversion operation for two cycles. In the following, in FIG. 4, the AD conversion operation period (or described as "sampling cycle") for the first cycle will be described as "first ADC operation period Tad1", and the AD conversion operation period for the second cycle will be described as "second ADC operation period Tad2". In the first ADC operation period Tad1, a period in which the analog signal is sampled will be described as "first sampling period Tsamp1", the delay period will be described as "first delay period Tdly1", and the successive approximation period will be described as "first conversion period Tconv1". In the second ADC operation period Tad2, in the same manner as the first ADC operation period Tad1, the periods will be described respectively as "second sampling period Tsamp2", "second delay period Tdly2", and "second conversion period Tconv2".

As shown in FIG. 4, at time t0, the AD converter 23 starts an AD conversion operation of the first cycle. Time t0 to t3 corresponds to the first ADC operation period Tad1. More specifically, when the count signal S_cnt rises to level "H", the CLK generator 35 sets the conversion signal S_cv to level "L", and sets the sampling clock signal CLK_S to level "H". The CLK generator 35 ends the oscillation of the comparator clock signal CLK_C based on the conversion signal S_cv. The DAC 30 starts sampling the analog signal based on the sampling clock signal CLK_S. Time t0 to t1 corresponds to the first sampling period Tsamp1.

At time t1, the AD converter 23 ends the sampling. More specifically, when the master clock signal CLK_M rises to level "H", in the CLK generator 35, the sampling clock signal CLK_S is set to level "L". The DAC 30 ends sampling the analog signal based on the sampling clock signal CLK_S. At the random delay generator 36 in the CLK generator 35, when the master clock signal CLK_M rises to level "H", the first delay period Tdly1 is generated. Time t1 to t2 corresponds to the first delay period Tdly1.

At time t2, that is, after the first delay period Tdly1 has passed, the AD converter 23 starts successive approximation conversion. Time t2 to t3 corresponds to the first conversion period Tconv1. More specifically, after the first delay period Tdly1 has passed, the CLK generator 35 sets the conversion signal S_cv to level "H". The CLK generator 35 generates the comparator clock signal CLK_C based on the conversion signal S_cv. In the example of FIG. 4, an 8 cycle pulse is generated in correspondence to the 8 bit AD conversion. The counter 34 sets the count signal S_cnt to level "L" based on the conversion signal S_cv, and starts counting.

At time t3, the AD converter 23 ends the AD conversion operation of the first cycle, and starts the AD conversion operation of the second cycle. Time t3 to t6 corresponds to the second ADC operation period Tad2. More specifically, in the same manner as at time t0, when the number of counts reaches eight times, the counter 34 sets the count signal S_cnt to level "H". When the count signal S_cnt rises to level "H", the CLK generator 35 sets the conversion signal S_cv to level "L", and sets the sampling clock signal CLK_S to level "H". The CLK generator 35 ends the oscillation of the comparator clock signal CLK_C based on the conversion signal S_cv. The DAC 30 starts sampling the analog signal in the AD conversion operation of the second cycle based on the sampling clock signal CLK_S. Time t3 to t4 corresponds to the second sampling period Tsamp2.

At time t4, in the same manner as at time t1, the AD converter 23 ends the sampling. At the random delay generator 36, when the master clock signal CLK_M rises to level "H", the second delay period Tdly2 is generated. Time t4 to t5 corresponds to the second delay period Tdly2.

At time t5, in the same manner as at time t2, after the second delay period Tdly2 has passed, the AD converter 23 starts successive approximation conversion. Time t5 to t6 corresponds to the second conversion period Tconv2.

At time t6, in the same manner as at time t3, the AD converter 23 ends the second AD conversion operation.

Here, the length of the first ADC operation period Tad1 and the length of the second ADC operation period Tad2 are different. More specifically, the length of the first sampling period Tsamp1 and the length of the second sampling period Tsamp2 are different. The length of the first delay period Tdly1 and the length of the second delay period Tdly2 are also different. That is, the lengths of the sampling period Tsamp and the delay period Tdly are different for each AD conversion operation (sampling cycle). In contrast, the lengths of the first conversion period Tconv1 and the second conversion period Tconv2 are almost the same. That is, the length of the conversion period Tconv in each AD conversion operation is almost the same.

The first cycle of the master clock signal CLK_M, which starts from the rise to level "H", and is, for example, between time t1 to t4, includes the first delay period Tdly1, the first conversion period Tconv1, and the second sampling period Tsamp2. Therefore, when the first cycle of the master clock signal CLK_M is Tm, and the minimum sampling period necessary for sampling is Ts_min, the delay period Tdly satisfies the relationship of Tdly<(Tm−Tconv−Ts_min).

1.5 Effect According to Present Embodiment

The configuration according to the present embodiment is capable of reducing spurious emissions in a wireless communication device that includes an AD converter in a receiver. The effect will be explained below.

When converting an analog signal (radio-frequency signal) into a digital signal at the AD converter, a harmonic of an internal clock signal used at the AD converter becomes an extraneous emission (spurious emission). When the spurious emission propagates into an RF analog circuit inside the wireless communication device, a part of the spurious emission sometimes overlaps with a frequency band of the received radio-frequency signal. The spurious emission then becomes a noise of the radio-frequency signal, which would degrade reception sensitivity of the wireless communication device. In the case of dealing with spurious emissions by using a passive element, a method of coupling a decoupling capacitor having a large capacity between the AD converter and a power source is known. However, adding the decoupling capacitor would increase the circuit surface area.

In contrast, in the configuration of the present embodiment, the AD converter comprises a CLK generator that includes a random delay generator. Furthermore, the period from the end of sampling to the start of successive approximation can be set to have different lengths for each sampling of the analog signal. That is, the timing of the sampling clock signal and the comparator clock signal can be shifted for each sampling. This allows the peak of the harmonic to be scattered, which would reduce spurious emissions.

Furthermore, the configuration according to the present embodiment is capable of reducing the noise of the radio-frequency signal that is caused by spurious emissions in the wireless communication device. Therefore, the degradation of the reception sensitivity in the wireless communication device can be suppressed.

Furthermore, since the noise caused by spurious emissions can be reduced, the configuration according to the present embodiment is capable of reducing the number of passive elements such as the decoupling capacitor used for anti-noise measure. Therefore, the circuit area of the wireless communication device can be reduced.

2. Second Embodiment

An AD converter and a wireless communication device according to the second embodiment will be explained. In the second embodiment, a specific example of the CLK generator of the first embodiment will be described. In the following, only the matters different from the first embodiment will be explained.

2.1 Configuration of CLK Generator

The CLK generator will be explained using FIG. 5.

Figure 5:
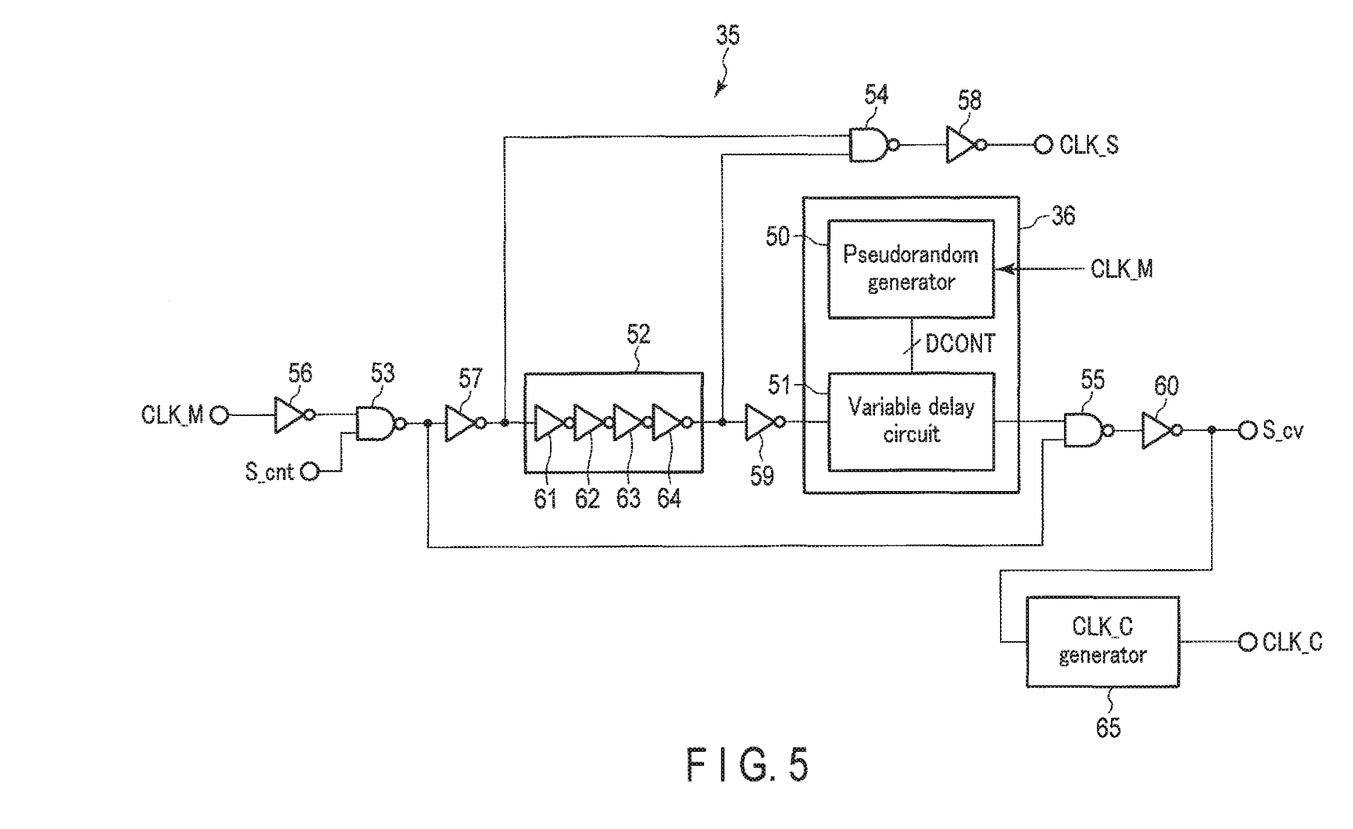
FIG. 5 is a circuit diagram of a CLK generator included in an analog-to-digital converter according to a second embodiment.

As shown in FIG. 5, the CLK generator 35 includes a random delay generator 36, a delay circuit 52, NAND elements 53 to 55, inverters 56 to 60, and a CLK_C generator 65.

The random delay generator 36 includes a pseudorandom generator 50 and a variable delay circuit 51.

The pseudorandom generator 50 generates a random digital signal DCONT at a timing at which a master clock signal CLK_M rises, and transmits the signal to the variable delay circuit 51.

The variable delay circuit 51 varies a delay period based on the digital signal DCONT.

The delay circuit 52 includes inverters 61 to 64, and outputs an input signal by delaying it for a given period. The number of inverters can be set to any even number in accordance with the delay period to prevent the signal from being inverted.

The coupling of each element will be explained in detail below.

The master clock signal CLK_M is input to an input terminal of the inverter 56. An output terminal of the inverter 56 is coupled to a first input terminal of the NAND element 53.

The count signal S_cnt is input to a second input terminal of the NAND element 53. An output terminal of the NAND element 53 is coupled to an input terminal of the inverter 57 and a first input terminal of the NAND element 55.

An output terminal of the inverter 57 is coupled to an input terminal of the delay circuit 52 and a first input terminal of the NAND element 54.

An output terminal of the delay circuit 52 is coupled to a second input terminal of the NAND element 54 and an input terminal of the inverter 59.

An output terminal of the NAND element 54 is coupled to an input terminal of the inverter 58.

An output terminal of the inverter 58 outputs a sampling clock signal CLK_S.

An output terminal of the inverter 59 is coupled to an input terminal of the random delay generator 36.

An output terminal of the random delay generator 36 is coupled to a second input terminal of the NAND element 55.

An output terminal of the NAND element 55 is coupled to an input terminal of the inverter 60.

A conversion signal S_cv is output from an output terminal of the inverter 60.

The CLK_C generator 65 generates a comparator clock signal CLK_C based on the conversion signal S_cv (output signal of inverter 60).

2.2 Operation of CLK Generator

A specific example of the operation of the CLK generator 35 will be explained using FIG. 5.

At, for example, time t1 explained in FIG. 4 of the first embodiment, when the master clock signal CLK_M rises to level "H" in a state where the count signal S_cnt is level "H", an level "L" signal is input to the first input terminal of the NAND element 53. Therefore, the output of the NAND element 53 is set to level "H". Then, a level "L" signal is input to the first input terminal of the NAND element 54. Thus, the output of the NAND element 54 is set to level "H". Therefore, the sampling clock signal CLK_S (output of the inverter 58) is set to level "L". A level "H" signal is input to the first input terminal of the NAND element 55. A level "H" signal is input to the second input terminal of the NAND element 55 after the lapse of the delay period based on the delay circuit 52 and the variable delay circuit 51, and the output of the NAND element 55 is set to level "L". Therefore, after the lapse of the delay period, the conversion signal S_cv (output of the inverter 60) is set to level "H".

At, for example, time t3 explained in FIG. 4 of the first embodiment, when the count signal S_cnt rises to level "H" in a state where the master clock signal CLK_M is level "L", the output of the NAND element 53 is set to level "L". Then, a level "H" signal is input to the first input terminal of the NAND element 54. After the delay by the delay circuit 52, a level "H" signal is input to the second input terminal of the NAND element 54. Thus, the output of the NAND element 54 is set to level "L". Therefore, the sampling clock signal CLK_S (output of the inverter 58) is set to level "H". A level "L" signal is input to the first input terminal of the NAND element 55. The output of the NAND element 55 is set to level "H". Therefore, the conversion signal S_cv (output of the inverter 60) is set to level "L" without being delayed by the delay circuit 52 and the variable delay circuit 51.

2.3 Effect According to Present Embodiment

The configuration according to the present embodiment can be applied to the first embodiment. Thus, the same effect as the first embodiment can be obtained.

3. Third Embodiment

The third embodiment will be explained below. In the third embodiment, three specific examples regarding the variable delay circuit explained in the second embodiment will be presented. In the following, only the matters different from the first and the second embodiments will be explained.

3.1 First Example

A first example of the third embodiment will be explained using FIG. 6.

Figure 6:
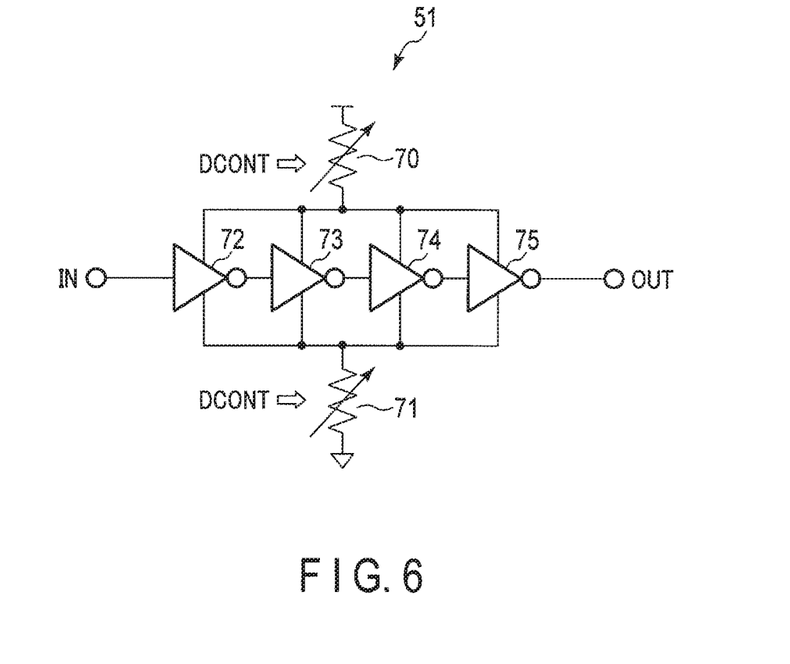
FIG. 6 is a circuit diagram of a variable delay circuit included in an analog-to-digital converter according to a first example of a third embodiment.

As shown in FIG. 6, a variable delay circuit 51 includes variable resistor elements (or, described as "variable resistors") 70 and 71, and inverters 72 to 75.

Input terminals and output terminals of each of the inverters 72 to 75 are coupled in series. The input terminal of the inverter 72 is coupled to the input terminal of the variable delay circuit 51, and the output terminal of the inverter 75 is coupled to the output terminal of the variable delay circuit 51. Power-supply voltage terminals of the inverters 72 to 75 are coupled in common to a power-supply voltage line (power-supply voltage is applied) through the variable resistor element 70. Ground voltage terminals of the inverters 72 to 75 are coupled in common and grounded through the variable resistor element 71.

The variable resistor elements 70 and 71 vary a resistance value in accordance with a digital signal DCONT received from a pseudorandom generator 50. By varying the resistance value of the variable resistor elements 70 and 71, the amount of current flowing in the inverters 72 to 75 can be adjusted. Therefore, the inversion velocity of a signal in each inverter can be adjusted.

3.2 Second Example

Next, a second example of the third embodiment will be explained using FIG. 7. The second example shows an example of circuit configurations of the variable resistors 70 and 71 of the first example. In the following, only the matters different from the first example will be explained.

Figure 7:
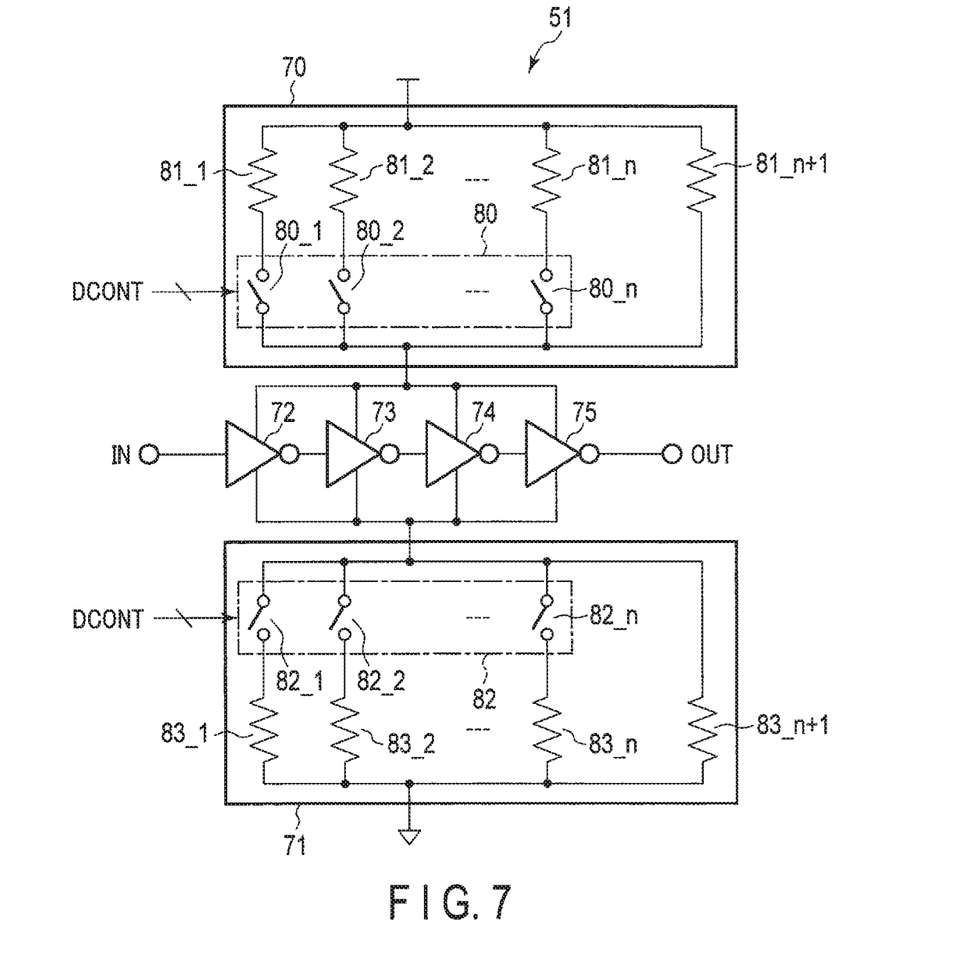
FIG. 7 is a circuit diagram of a variable delay circuit included in an analog-to-digital converter according to a second example of the third embodiment.

As shown in FIG. 7, inverters 72 to 75 are coupled in the same manner as in FIG. 6 of the first example.

In accordance with the number of bits n of a digital signal DCONT (n is an integer equal to or greater than two), the variable resistor 70 includes n switching elements 80 (80_1~80_n) and n+1 resistor elements 81 (81_1~81_n, 81_n+1).

First terminals of the switching elements 80_1~80_n are coupled in common to a power-supply voltage terminal of the inverters 72 to 75. Second terminals of the switching elements 80_1~80_n are coupled to a power-supply voltage line respectively through the resistor elements 81_1~81_n. Each of the switching elements 80 is controlled to be ON/OFF in accordance with the digital signal DCONT.

One end of the resistor element 81_n+1 is coupled to the power-supply voltage line, and the other end is coupled to the power-supply voltage terminal of inverters 72 to 75. The resistor element 81_n+1 is provided to stabilize the output of the inverters 72 to 75 in a case where all of the switching elements 80_1~80_n become an OFF state. The resistance value of the n+1 resistor elements 81 can be set as appropriate, and may be, for example, a power of 2, that is $2^0 R$, $2^1 R$, ..., $2(n)R$ (R is any resistance value).

In the same manner as the variable resistor 70, in accordance with the number of bits n of the digital signal DCONT, the variable resistor 71 includes n switching elements 82 (82_1~82_n) and n+1 resistor elements 83 (83_1~83_n, 83_n+1). In the same manner as the resistor element 81, the resistance value of the n+1 resistor elements 83 can be set as appropriate.

First terminals of the switching elements 82_1~82_n are coupled in common to a power-supply voltage terminal of the inverters 72 to 75. Second terminals of the switching elements 82_1~82_n are grounded respectively through the resistor elements 83_1~83_n. Each of the switching elements 82 is controlled to be ON/OFF in accordance with the digital signal DCONT.

One end of the resistor element 83_n+1 is grounded, and the other end is coupled to the power-supply voltage terminal of inverters 72 to 75. In the same manner as the resistor element 81_n+1, the resistor element 83_n+1 is provided to stabilize the output of the inverters 72 to 75.

The resistance value of the n+1 resistor elements 83 can be set as appropriate, and, for example, may be a power of 2, that is $2^0 R$, $2^1 R$, ..., $2^{(n)}R$ (R is any resistance value).

3.3 Third Example

Next, a third example of the third embodiment will be explained using FIG. 8. In the third example, a case in which a variable capacitance circuit is used, which is different from the first and the second examples, will be explained. In the following, only the matters different from the first and the second examples will be explained.

Figure 8:
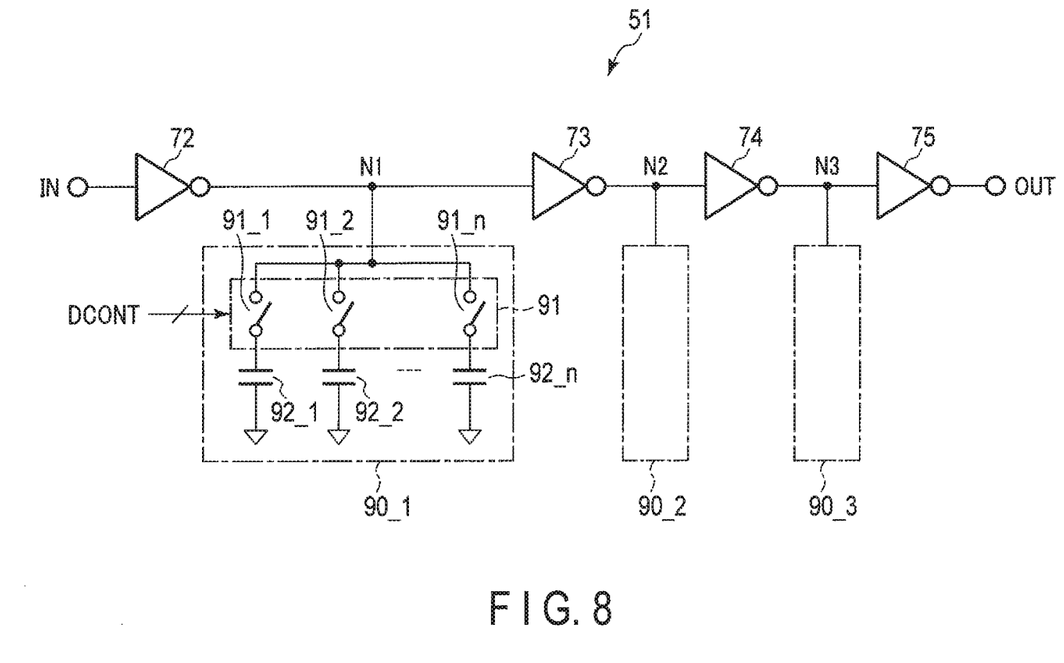
FIG. 8 is a circuit diagram of a variable delay circuit included in an analog-to-digital converter according to a third example of the third embodiment.

As shown in FIG. 8, a variable delay circuit 51 includes inverters 72 to 75, and three variable capacitance circuits 90_1~90_3. In the example of FIG. 8, to simplify the explanation, the configurations inside the variable capacitance circuits 90_2 and 90_3 are omitted; however, they have the same configuration as the variable capacitance circuit 90_1.

An input terminal of the inverter 72 is coupled to an input terminal of the variable delay circuit 51, and an output terminal of the inverter 72 is coupled to node N1. An input terminal of the inverter 73 is coupled to the node N1, and an output terminal of the inverter 73 is coupled to node N2. An input terminal of the inverter 74 is coupled to the node N2, and an output terminal of the inverter 74 is coupled to node N3. An input terminal of the inverter 75 is coupled to the node N3, and an output terminal of the inverter 75 is coupled to an output terminal of the variable delay circuit 51.

The variable capacitance circuits 90_1 to 90_3 are coupled respectively to the nodes N1 to N3, and vary the capacitance value in accordance with a digital signal DCONT.

In accordance with the number of bits n of the digital signal DCONT, the variable capacitance circuit 90_1 includes n switching elements 91 (91_1~91_n) and n capacitance elements 92 (92_1~92_n). The capacitance value of the n capacitance elements 92 can be set as appropriate, and, for example, may be a power of 2, that is $2^0$ C., $2^1$C., ..., $2^{(n-1)}$C (C is any resistance value).

First terminals of the switching elements 91_1~91_*n* are coupled in common to the node N1. A second terminal of each of the switching elements 91 is grounded through the capacitance element 92. Each of the switching elements 91 is controlled to be ON/OFF in accordance with the digital signal DCONT.

The charging capacity of the nodes N1~N3 is adjustable by changing the capacitance value of the variable capacitance circuits 90_1~90_3. Therefore, the speed of propagation of the signal between each inverter is adjustable.

3.4 Effect According to Present Embodiment

The configuration according to the present embodiment can be applied to the first and the second embodiments. Thus, the same effects as the first and the second embodiments can be obtained.

4. Modifications

The analog-to-digital converters according to the above embodiments include a digital-to-analog converter (30 in FIG. 2) configured to generate an analog voltage based on a sampled analog voltage and a digital code (S_dac in FIG. 2), a clock generator (35 in FIG. 2) configured to generate a first clock signal (CLK_C in FIG. 2), a comparator (31 in FIG. 2) configured to receive the analog voltage from the digital-to-analog converter, and perform digital output based on the first clock signal, and a controller (33 in FIG. 2) configured to generate the digital code based on the digital output of the comparator. The clock generator varies the delay period (Tdly in FIG. 4) from the end of sampling of the analog signal to the start of generating the first clock signal for each sampling of the analog signal.

By applying the above embodiments, an AD converter that is capable of reducing the effect of spurious emissions can be provided.

The embodiments are not limited to the configurations explained above, and can be modified in various ways.

4.1 First Modification

For example, in the above embodiments, the AD converters may be of differential configurations. An example of differential configurations will be explained using FIG. 9.

Figure 9:
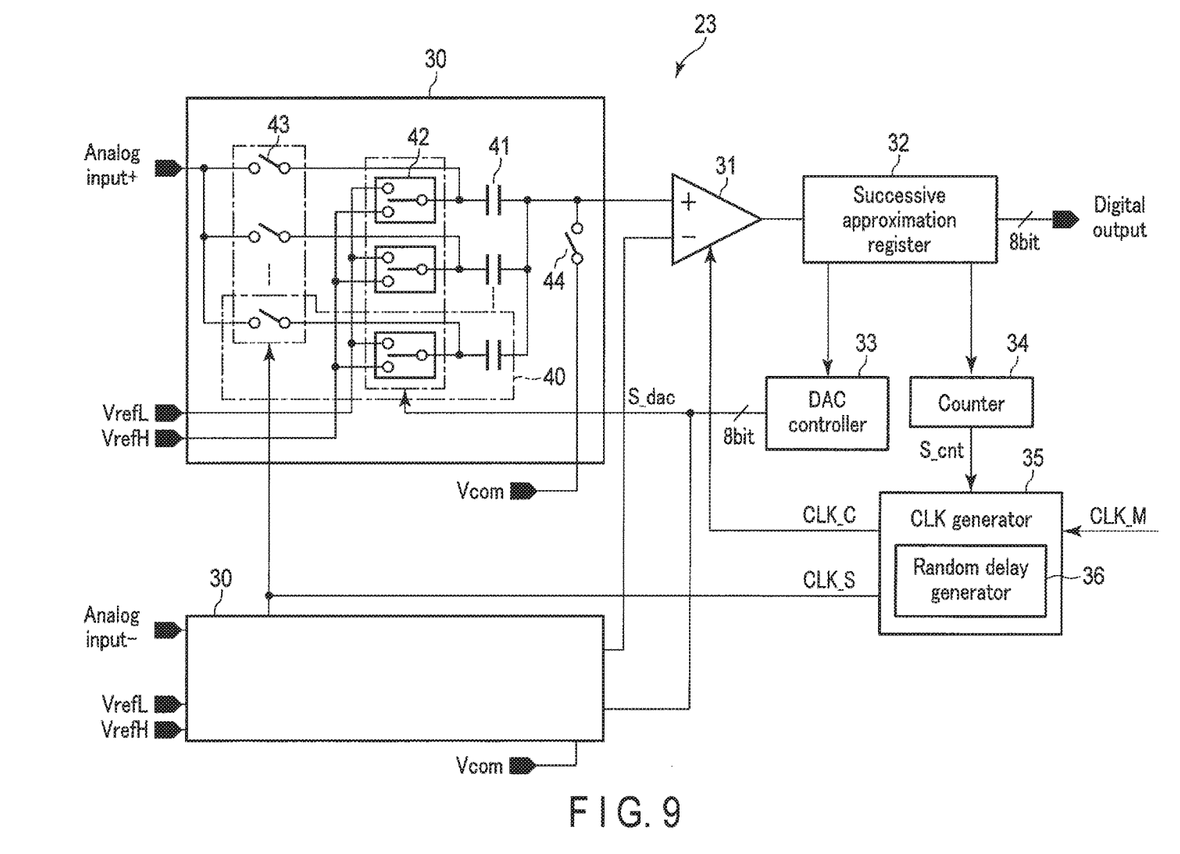
FIG. 9 is a block diagram of an analog-to-digital converter according to a first modification.

As shown in FIG. 9, the difference from FIG. 2 of the first embodiment is that there are two DACs 30 with the same configurations that correspond to analog input signals on the positive side and the negative side (analog input "+" and analog input "−"). An output terminal of the DAC 30 to which the analog input signal on the positive side is input is coupled to a non-inverting input terminal ("+" terminal) of a comparator 31, and an output terminal of the DAC 30 to which the analog input signal on the negative side is input is coupled to an inverting input terminal ("−" terminal) of the comparator 31.

The same effect as the first embodiment can also be obtained in the above configuration.

4.2 Other Modifications

In the above embodiments, for example, the DAC is not limited to the configuration shown in FIG. 2. The DAC may have other configurations in which capacitance elements are used, or, may, for example, have a configuration in which a resistor element is used instead of the capacitance element.

Furthermore, in the above embodiments, the variable delay circuit may have a configuration in which the number of inverters to be coupled varies in accordance with the digital signal DCONT.

Furthermore, in the above embodiments, the successive approximation type AD converter is not limited to the configuration shown in FIG. 2. Furthermore, the AD converter is not limited to the successive approximation type AD converter.

In addition, the term "couple" or "connect" in the above embodiments includes a state of indirect coupling via, for example, a transistor or a resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An analog-to-digital converter comprising:
   a digital-to-analog converter configured to generate an analog voltage based on a sampled analog signal and a digital code;
   a clock generator configured to generate a first clock signal;
   a comparator configured to receive the analog voltage from the digital-to-analog converter and perform digital output based on the first clock signal; and
   a controller configured to generate the digital code based on the digital output of the comparator,
   wherein the clock generator varies a delay period, which is from an end of sampling of the analog signal to a start of generating the first clock signal, for each sampling of the analog signal.

2. The converter according to claim 1, wherein the clock generator includes:
   a signal generator configured to generate a pseudorandom digital signal; and
   a variable delay circuit configured to adjust a length of the delay period based on the pseudorandom digital signal.

3. The converter according to claim 1, wherein
   an analog-to-digital conversion operation includes a first operation period in which an analog-to-digital conversion of a first analog signal is performed and a second operation period in which an analog-to-digital conversion of a second analog signal is performed,
   the first operation period includes a first sampling period in which the first analog signal is sampled, and a first delay period which is from after the first sampling period to a start of generating the first clock signal,
   the second operation period includes a second sampling period in which the second analog signal is sampled, and a second delay period which is from after the second sampling period to a start of generating the first clock signal, and
   a length of the first operation period and a length of the second operation period are different, a length of the first sampling period and a length of the second sampling period are different, and a length of the first delay period and a length of the second delay period are different.

4. The converter according to claim 1, wherein the analog-to-digital converter is a successive approximation type.

5. The converter according to claim 1, wherein the clock generator generates a second clock signal which controls sampling at the digital-to-analog converter.

6. The converter according to claim 1, further comprising:
a register configured to store a plurality of bits of a digital signal output from the comparator; and
a counter configured to count the number of bits of the digital signal stored by the register, and transmits a first signal to the clock generator in accordance with the counting result.

7. The converter according to claim 3, wherein
the first operation period further includes a first conversion period in which the comparator performs digital output,
the second operation period further includes a second conversion period in which the comparator performs digital output, and
the lengths of the first conversion period and the second conversion period are approximately the same.

8. The converter according to claim 6, wherein, while the number of the bits is counted, the counter sets the first signal to a first logic level, and when the number of counts of the bits reaches a set value, the counter sets the first signal to a second logic level and resets the number of the counts.

9. The converter according to claim 6, wherein the clock generator includes:
a signal generator configured to generate a pseudorandom digital signal based on a master clock signal;
a variable delay circuit configured to adjust a length of the delay period based on the pseudorandom digital signal; and
a first clock signal generator configured to generate the first clock signal based on a second signal which is based on an output signal of the variable delay circuit.

10. The converter according to claim 8, wherein the clock generator generates a second clock signal which controls sampling at the digital-to-analog converter, and
when the first signal transitions from the first logic level to the second logic level, the clock generator inverts a logic level of the second clock signal, and the digital-to-analog converter starts sampling based on the second clock signal.

11. The converter according to claim 9, wherein the clock generator further includes:
a delay circuit including an input terminal to which a third signal based on the first signal and the master clock signal is input, and an output terminal which is coupled to an input terminal of the variable delay circuit, and
the clock generator generates a second clock signal which controls sampling at the digital-to-analog converter based on the third signal and a fourth signal which is output from the delay circuit.

12. The converter according to claim 11, wherein the clock generator further includes:
a first circuit including a first input terminal to which the first signal is input, and a second input terminal to which an inversion signal of the master clock signal is input, and configured to output a fifth signal based on a calculation result of the first signal and the inversion signal of the master clock signal; and
a second circuit configured to invert the fifth signal and output the inverted fifth signal as the third signal to the input terminal of the delay circuit.

13. The converter according to claim 11, wherein the clock generator further includes:
a third circuit including a first input terminal to which the third signal is input, and a second input terminal to which the fourth signal is input, and configured to output a sixth signal based on a calculation result of the third signal and the fourth signal; and
a fourth circuit configured to invert the sixth signal and output the inverted sixth signal as the second clock signal.

14. The converter according to claim 12, wherein the clock generator further includes:
a fifth circuit including a first input terminal to which the output signal of the variable delay circuit is input, and a second input terminal to which the fifth signal is input, and configured to output a seventh signal based on a calculation result of the output signal of the variable delay circuit and the fifth signal; and
a sixth circuit configured to invert the seventh signal and output the inverted seventh signal as the second signal.

15. A wireless communication device comprising:
a receiver including the analog-to-digital converter;
a processor configured to process a digital signal received from the receiver; and
a transmitter configured to convert the digital signal received from the processor into an analog signal, and output the signal,
wherein the analog-to-digital converter includes:
a digital-to-analog converter configured to generate an analog voltage based on a sampled analog signal and a digital code;
a clock generator configured to generate a first clock signal;
a comparator configured to receive the analog voltage from the digital-to-analog converter and perform digital output based on the first clock signal; and
a controller configured to generate the digital code based on the digital output of the comparator, and
the clock generator varies a delay period, which is from an end of sampling of the analog signal to a start of generating the first clock signal, for each sampling of the analog sign.

16. The device according to claim 15, further comprising an input/output circuit configured to transmit an analog input signal received through an antenna to the receiver, and transmit the analog signal received from the transmitter to an external device through the antenna.

17. The device according to claim 16, wherein the receiver further includes:
a low noise amplifier (LNA); and
a low pass filter (LPF),
wherein the input analog signal received from the input/output circuit is input to the analog-to-digital converter through the low noise amplifier and the low pass filter.

18. An analog-to-digital converter comprising:
a first digital-to-analog converter configured to generate a first analog voltage based on a sampled first analog signal and a digital code;
a second digital-to-analog converter configured to generate a second analog voltage based on a sampled second analog signal and the digital code;
a clock generator configured to generate a first clock signal;

a comparator configured to perform digital output of a result obtained by comparing the first analog voltage and the second analog voltage based on the first clock signal; and a controller configured to generate the digital code based on the digital output of the comparator, wherein the clock generator varies a delay period, which is from an end of sampling of the first and the second analog signals to a start of generating the first clock signal, for each sampling of the analog signal.

19. The converter according to claim 18, wherein the clock generator generates a second clock signal which controls sampling at the first and the second digital-to-analog converters.

20. The converter according to claim 18, further comprising:

a register configured to store a plurality of bits of a digital signal output from the comparator; and a counter configured to count the number of bits of the digital signal stored by the register, and transmits a first signal to the clock generator in accordance with the counting result.

* * * * *